United States Patent
Hoomes et al.

(10) Patent No.: US 8,154,337 B1
(45) Date of Patent: *Apr. 10, 2012

(54) APPARATUS AND METHOD FOR AUTOMATED OFFSET REDUCTION IN MATCHED DIFFERENTIAL INPUT DEVICES

(75) Inventors: Benjamin Hoomes, Milpitas, CA (US); Adam Abed, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

This patent is subject to a terminal disclaimer.

(21) Appl. No.: 12/455,656

(22) Filed: Jun. 4, 2009

Related U.S. Application Data (60) Provisional application No. 61/215,562, filed on May 7, 2009.

(51) Int. Cl.
*H03F 1/02* (2006.01)
(52) U.S. Cl. .......................................................... 330/9
(58) Field of Classification Search ....... 330/9, 252–261
See application file for complete search history.

(56) References Cited

U.S. PATENT DOCUMENTS

| | | | |
|---|---|---|---|
| 4,462,002 A | | 7/1984 | Schade, Jr. |
| 6,011,425 A | | 1/2000 | Oh et al. |
| 6,140,872 A | * | 10/2000 | McEldowney ................ 330/9 |
| 6,175,261 B1 | | 1/2001 | Sundararaman et al. |
| 6,424,211 B1 | | 7/2002 | Nolan et al. |
| 6,628,169 B2 | | 9/2003 | Ivanov et al. |

OTHER PUBLICATIONS

"Mono, Bridge-Tide Load, Ceramic Speaker Driver with I2C Volume Control and Reset",National Semicondutor, LM48557 Boomer Audio Power Amplifier Series, Aug. 6, 2009, p. 1-17.

* cited by examiner

*Primary Examiner* — Robert Pascal
*Assistant Examiner* — Khiem Nguyen
(74) *Attorney, Agent, or Firm* — Andrew S. Viger; Wade J. Brady, III; Frederick J. Telecky, Jr.

(57) ABSTRACT

An amplifier includes an input stage, a comparator coupled to an output of the differential input stage, and a trimming controller coupled to an output of the comparator. The input stage includes a plurality of trim devices coupled in parallel with a first input device. The trimming controller is adapted to configure the trim devices based on an output of the comparator. The trim devices may selectively control a total effective device area of the first input device. Each of the trim devices, when enabled, may add a specified area to the total effective device area of the first input device. The input stage may also include a second plurality of trim devices coupled in parallel with a second input device.

20 Claims, 11 Drawing Sheets

APPARATUS AND METHOD FOR AUTOMATED OFFSET REDUCTION IN MATCHED DIFFERENTIAL INPUT DEVICES

CROSS-REFERENCE TO RELATED APPLICATION(S) AND CLAIM OF PRIORITY

The present application is related to U.S. Provisional Patent Application No. 61/215,562, filed May 7, 2009, entitled "APPARATUS AND METHOD OF AUTOMATED DC OFFSET REDUCTION IN AMPLIFIER DIFFERENTIAL INPUT DEVICES". Provisional Patent Application No. 61/215,562 is assigned to the assignee of the present application and is hereby incorporated by reference into the present application as if fully set forth herein. The present application hereby claims priority under 35 U.S.C. §119(e) to U.S. Provisional Patent Application No. 61/215,562.

TECHNICAL FIELD

The present invention is generally directed to amplifiers and, in particular, to an apparatus and method for automated offset reduction in matched differential input devices.

BACKGROUND

DC offset in an amplifier may arise from device mismatch within the amplifier. For audio products, a high offset may lead to poor "pop and click" performance. Offset may arise from a number of sources during fabrication of an amplifier. Device areas, current mirrors, threshold voltages, and/or conduction factors may differ in an integrated circuit due to process variations.

Many precision and power amplifiers utilize a trimming process during production to achieve high precision DC offset. However, production trimming may increase process and testing costs for such amplifiers.

Alternatively, matching may be improved by layout techniques (for example, the common centroid technique) and/or by increasing a total area of the input devices. However, with such techniques, a degree of matching typically improves by the square root of the total area. In a typical CMOS process, reducing the maximum offset to millivolt levels may require a large area for the input pair, so much so that this technique may become cost prohibitive. To achieve microvolt offsets, other solutions (such as trimming, binning, or using a BiCMOS process) may also be expensive.

BRIEF DESCRIPTION OF THE DRAWINGS

For a more complete understanding of the present invention and its advantages, reference is now made to the following description taken in conjunction with the accompanying drawings, in which.

DETAILED DESCRIPTION

FIGS. 1 through 8B and the various embodiments used to describe the principles of the present invention in this patent document are by way of illustration only and should not be construed in any way to limit the scope of the invention. Those skilled in the art will understand that the principles of the present invention may be implemented in any type of suitably arranged amplifier.

Figure 1:
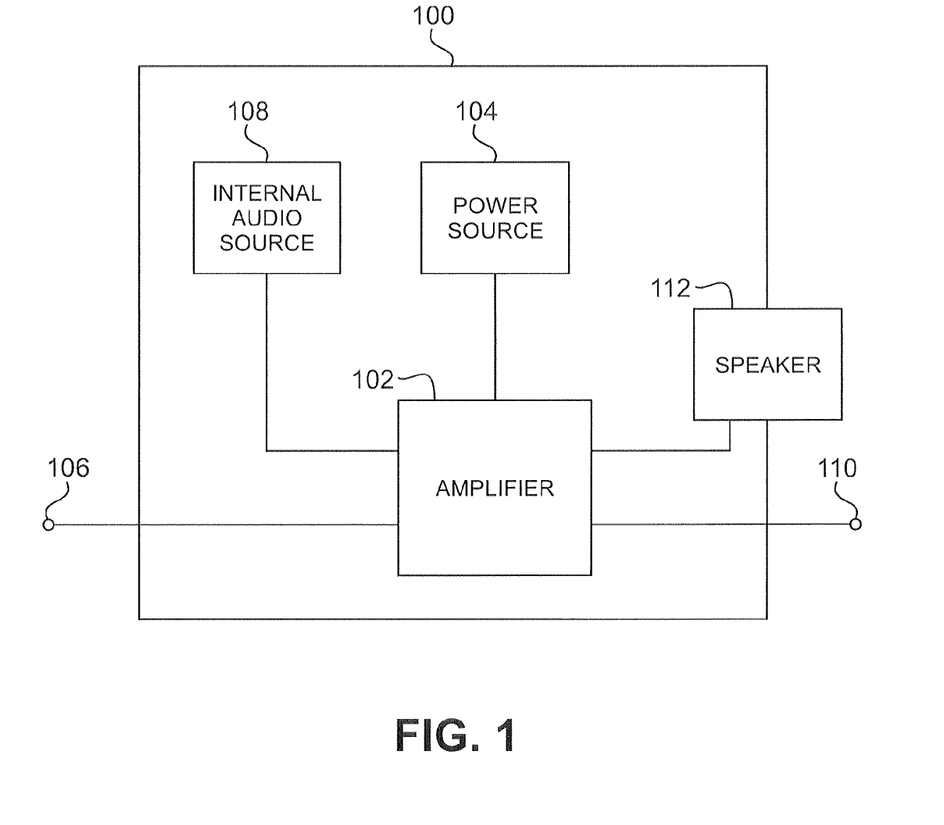
FIG. 1 presents a block diagram of an electronic device incorporating an amplifier according to this disclosure.

FIG. 1 presents a block diagram of an electronic device 100 incorporating an amplifier 102 according to this disclosure. The amplifier 102 receives electrical power from a power source 104. In some embodiments, the power source 104 is a battery. However, it will be understood that the power source 104 may also be a capacitor, an inductive power receiver, an AC/DC converter, or any other suitable source of operating power.

The amplifier 102 may be coupled to an external input connector 106, through which the amplifier 102 receives an audio signal to amplify. The amplifier 102 may also be coupled to an internal audio source 108. Examples of an internal audio source 108 include a cell phone or other wireless communication device, a broadcast radio receiver, a compact disc drive, and a digital music player.

The amplifier 102 may provide an amplified output signal to an external output connector 110. Examples of devices that may be coupled to the external output connector 110 include headphones and external speakers. The amplifier 102 may also be coupled to a speaker 112 mounted in the electronic device 100. In some embodiments, the amplifier 102 may include a switch to deliver its amplified output signal to a selected one of the external connector 110 and the speaker 112.

While the amplifier 102 in FIG. 1 is shown as a single block and its inputs and outputs are shown as single lines, it will be understood that in other embodiments the amplifier 102 may be a stereo amplifier whose inputs and outputs include left and right stereo signals. In still other embodiments, the amplifier 102 may include three or more channels of amplification.

Figure 2:
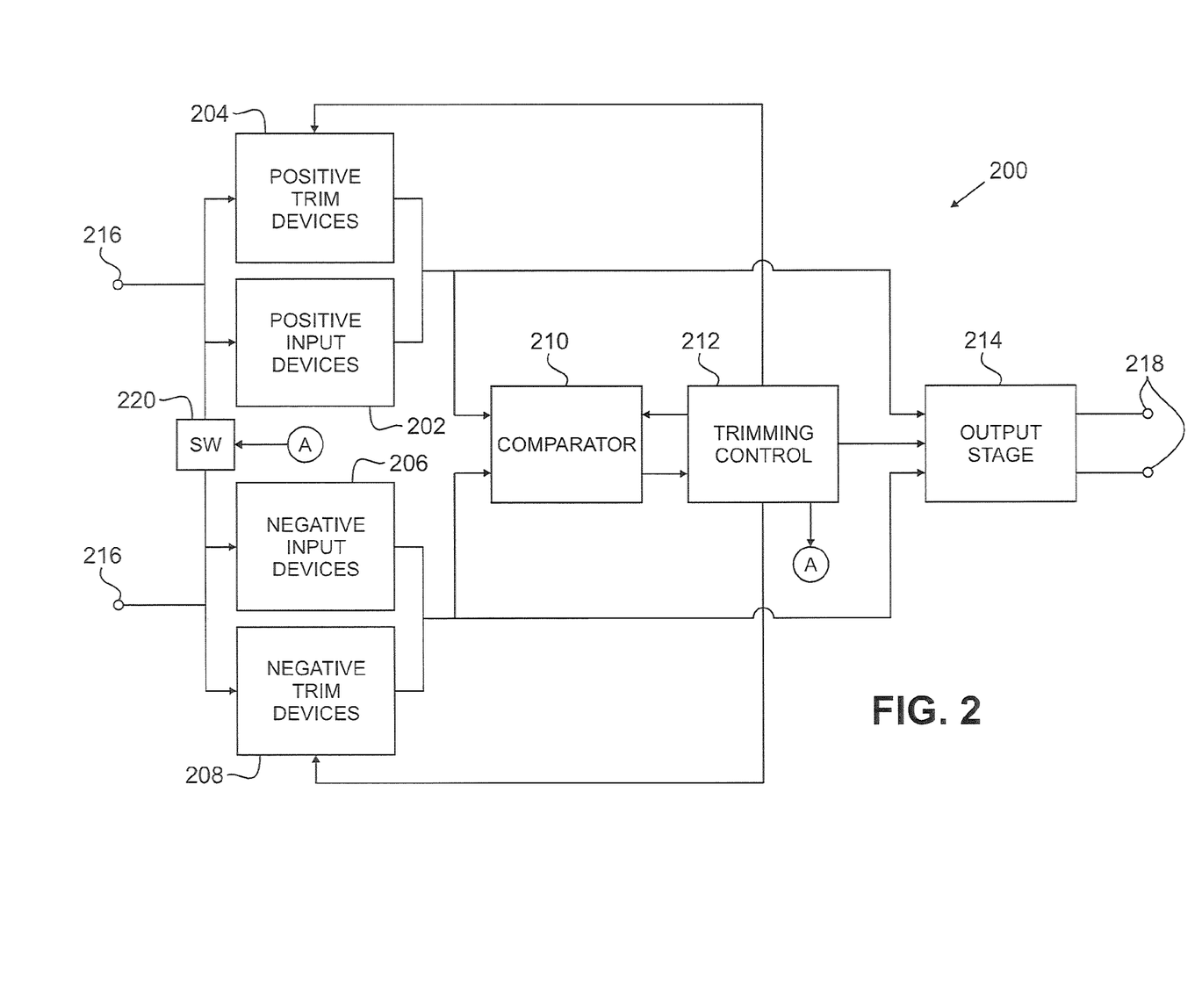
FIG. 2 presents a block diagram of an amplifier according to this disclosure.

FIG. 2 presents a block diagram of an amplifier 200 according to this disclosure. The amplifier 200 could, for example, be used as the amplifier 102 in FIG. 1. In this example, a differential input signal is received at input terminals 216. A positive side of the input signal is coupled to a positive input device 202 and positive trim devices 204. A negative side of the input signal is coupled to a negative input device 206 and negative trim devices 208.

Together, the input devices 202 and 206 and the trim devices 204 and 208 form a buffer stage (or input buffer) of the amplifier 200. The outputs of the positive input device 202 and the positive trim devices 204 are coupled to each other, to a first input of a comparator 210, and to a first input of an output stage 214. The outputs of the negative input device 206 and the negative trim devices 208 are coupled to each other, to a second input of the comparator 210, and to a second input of the output stage 214. The output stage 214 is a power stage that amplifies the signal received on its first and second inputs to desired levels to produce an amplified output signal, which is provided to output terminals 218.

For both the positive trim devices 204 and the negative trim devices 208, the individual trim devices have a smaller area than their associated input device. By operating the input device and associated trim devices in parallel, an effective total device area is created. This total device area may be changed by controllable amounts by switching individual trim devices into or out of operation. The trim devices may have equal areas to each other or may have different sizes. In one example, the sizes of the trim devices may be related in a binary sequence (1:2:4:8 and so on).

A trimming controller 212 is coupled to an output of the comparator 210. The trimming controller 212 is also coupled to a control input of the comparator 210 and is operable to enable and disable operation of the comparator 210. The trimming controller 212 is also coupled to control inputs of the positive trim devices 204 and the negative trim devices 208 and is operable to control their relative configurations. The trimming controller 212 is further coupled to a control input of the output stage 214 and is operable to enable and disable operation of the output stage 214. In addition, the trimming controller 212 is coupled to control a switch 220, which is operable to couple or decouple the inputs 216 to each other.

While the output stage 214 is shown as a balanced output, it will be understood that in other embodiments, the output stage 214 may produce a single-ended output. Such an embodiment is described in more detail with reference to FIGS. 5-8B. Furthermore, while the comparator 210 and the trimming controller 212 are shown interposed between the input buffer and the power stage of a single amplifier, it will be understood that, in other embodiments, the comparator 210 and the trimming controller 212 may be interposed between a first amplifier and a second amplifier in a two-stage amplifier design. Such an embodiment is described in more detail with reference to FIG. 4.

Figure 3:
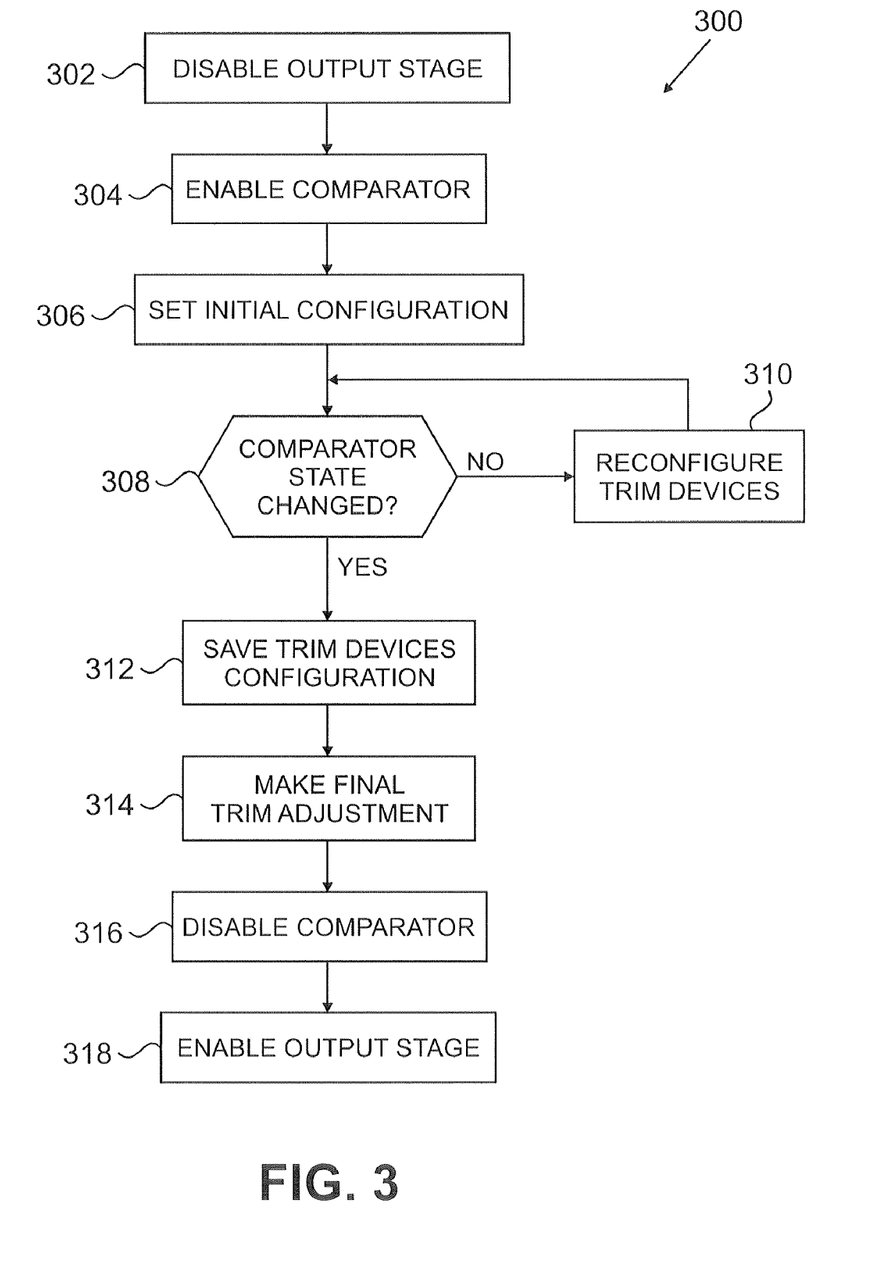
FIG. 3 presents a flow chart of a process according to this disclosure.

FIG. 3 presents a flow chart of a process (or method) 300 according to this disclosure, such as may be performed by the amplifier 200 of FIG. 2. The process 300 may be performed at initial power up of the amplifier 200. The process 300 may also be performed during operation of the amplifier 200 upon operator command or when the amplifier 200 is quiescent or disabled.

In general, the process 300 initializes the trim devices 204 and 208 to maximize an effective total device area of a first of the positive and negative input devices 202 and 206 and minimize an effective total device area of the second of the input devices 202 and 206. The configuration of the trim devices 204 and 208 is then varied in a systematic way to reduce the difference in effective total device areas of the two devices. The process 300 stops varying the configuration of the trim devices 204 and 208 when an indication is received that the most recent variation caused the total device area of the second input device to exceed the total device area of the first input device.

In step 302, the output stage 214 is disabled, and, in step 304, the comparator 210 is enabled. In step 306, the positive trim devices 204 and the negative trim devices 208 are set to an initial configuration, and the switch 220 is configured to couple the inputs 216 to each other. Also in step 306, once the trim devices 204 and 208 are configured and the output of the comparator 210 has settled to an initial state, the initial state of the comparator 210 is stored. In some embodiments, the initial configuration includes all negative trim devices 208 enabled and all positive trim devices 204 disabled, and the initial state of the comparator is low.

In step 308, the trimming control circuit 212 checks whether the output of the comparator 210 has changed state. If not, in step 310, the configuration of one or more of the trim devices 204 and 208 is changed, and the process returns to step 308 to re-check the output of the comparator 210.

In some embodiments, the trim devices 204 and 208 have equal sizes, and in each pass through step 310 a single negative trim device 208 is disabled. If all negative trim devices 208 are disabled without the output of the comparator 210 changing state, then in each subsequent pass through step 310 a single positive trim device 204 is enabled. In embodiments where the trim devices 204 and 208 have a size ratio of 1:2:4:8, more than one individual trim device 204 or 208 may be enabled and/or disabled in a binary pattern in step 310 in order to change the total area of the trim devices by a single unit of area on each pass through the step 310.

If a change of the state of the output of the comparator 210 is detected in step 308, the current configuration of the positive trim devices 204 and the negative trim devices 208 is saved (or locked) in step 312 for use after the power up period—i.e., during operation of the amplifier 200. In optional step 314, an additional trim device may be enabled, in order to move the configuration of the trim devices 204 and 208 back toward their configuration in the last pass through the step 310. The additional trim device may have a size that is one-half the size of the smallest of the trim devices 204 and 208. Enabling the additional trim device acts to center the range of remaining offset on zero offset.

In step 316, the comparator 210 is disabled and, in step 318, the output stage 214 is enabled. When the process 300 is completed, the input devices of the amplifier 200 have been configured to minimize the offset, and a startup transient signal on the output 218 of the output stage 214 is thereby minimized.

In the method 300, on each pass through step 310, one or more trim devices are switched into or out of either the positive or negative side of the input buffer, changing the effective total device area by a single unit of area and effectively 'sweeping' across a range of possible configurations. However, it will be understood that in other embodiments, other processes for finding a desired configuration of the trim devices 204 and 208 may be used.

In one such embodiment, on each pass through step 310, one or more trim devices may be switched into or out of both the positive and negative sides of the input buffer. In this way, process variations that may have affected the trim devices may be corrected by using both positive and negative trim devices when compensating for offset in the amplifier 200.

In another embodiment, a so-called 'binary search' may be used. Such a method may provide a quicker search for a desired configuration of the trim devices 204 and 208 than the sweep method described above. In general, in the binary search method, a test is made approximately in the center of a search space to determine in which half of the search space a desired solution may be found. Next, the same technique is applied to the half of the search space containing the desired solution; that is, a test is made approximately in the center of that half of the search space to determine in which half of that half the desired solution may be found. The technique continues, halving the remaining search space at each step until the desired solution is found.

In the amplifier 200, where the trim devices 204 and 208 have a size ratio of 1:2:4:8, the search space encompasses ratios of positive to negative effective total device area between 35:20 and 20:35. In a first step, the ratio may be set to 20:20 and the output of the comparator 210 noted. Depending upon the output of the comparator 210, the ratio may next be set to 28:20 or 20:28. If the ratio is set to 28:20, depending again upon the subsequent output of the comparator 210, the ratio may next be set to 32:20 or 24:20. Similarly, if the ratio is set to 20:28, the ratio may next be set to 20:24 or 20:32. The process continues with subsequent changes of 2 units and 1 unit of effective total device area. In this way, the remaining number of possible configurations is halved on each step of the method. This provides a search that may complete in less time than the 'sweep' search of the method 300.

Figure 4:
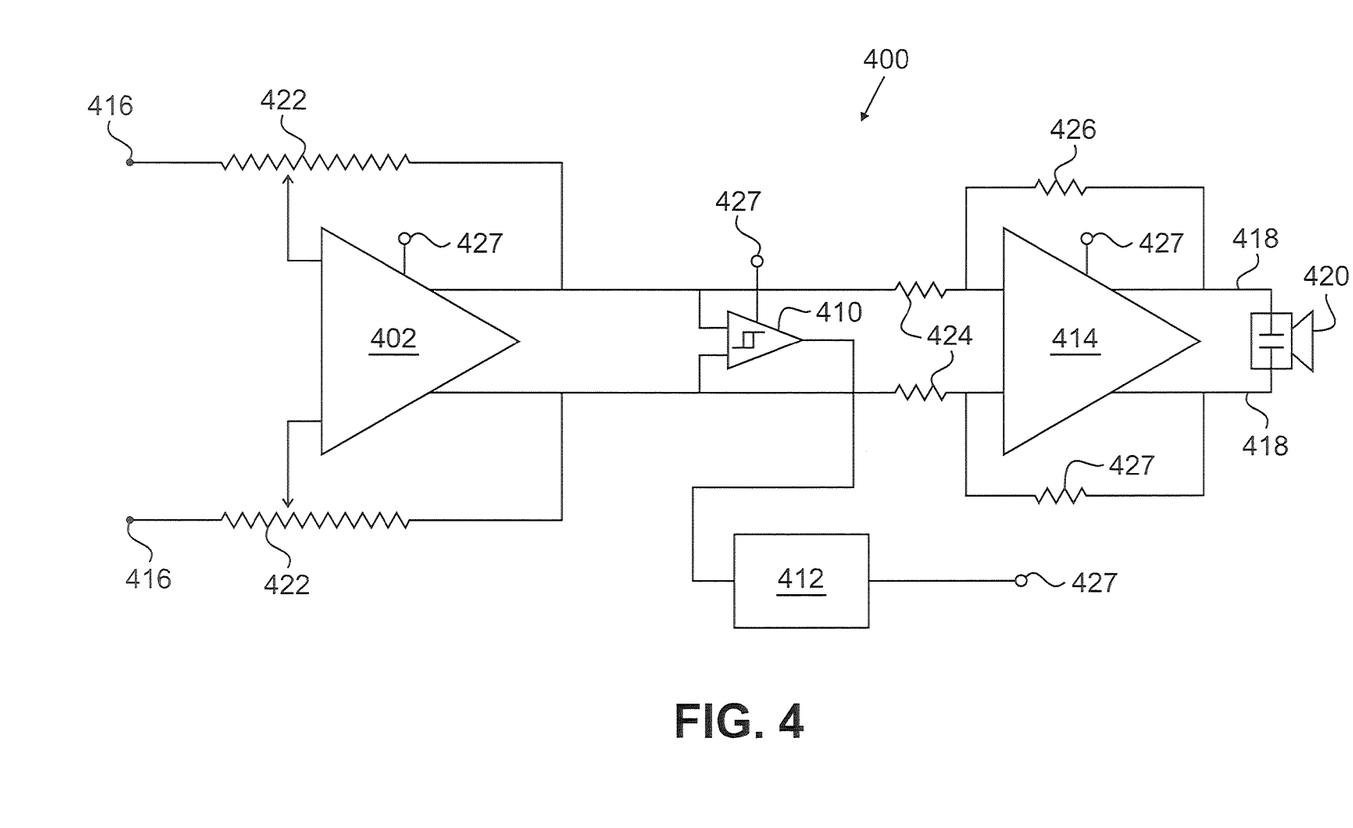
FIG. 4 presents a schematic diagram of an amplifier according to this disclosure.

FIG. 4 presents a schematic diagram of an amplifier 400 according to this disclosure. The amplifier 400 could, for example, be used as the amplifier 102 in FIG. 1. The amplifier 400 includes two complete amplifier stages, an amplifier 402 according to this disclosure and an amplifier 414, which may be an amplifier of any suitable design. A two-stage amplifier such as the amplifier 400 may be used in an application where high power levels are required at an output 418 of the second amplifier 414. One example of such an application is where a load 420, coupled to the output 418, is a ceramic speaker.

In amplifier 400, a differential input signal is received at input terminals 416. The input signal is coupled to inputs of the amplifier 402 through gain setting resistors 422, which set both an input resistance of the input signal, as well as a feedback resistance from outputs of the amplifier 402 to the inputs of the amplifier 402.

The outputs of the amplifier 402 are coupled through input resistors 424 to the input of the amplifier 414. The amplifier 414 amplifies the signal received through the input resistors 424 to desired levels to produce the amplified output signal 418, which is provided to the load 420. Feedback resistors 426 provide feedback from the outputs of the amplifier 414 to its inputs.

Also coupled to the outputs of the amplifier 402 is a comparator 410. An output of the comparator 410 is coupled to a trimming controller 412. The trimming controller 412 produces control signals 427, which are coupled to the amplifier 402 in order to selectively couple the inputs of the amplifier 402 and set the configuration of the input devices, as described above with reference to the method 300 of FIG. 3. The control signals 427 are also coupled to the comparator 410 and the amplifier 414 to allow the trimming controller 412 to selectively enable those devices, also as described above with reference to the method 300 of FIG. 3.

Figure 5:
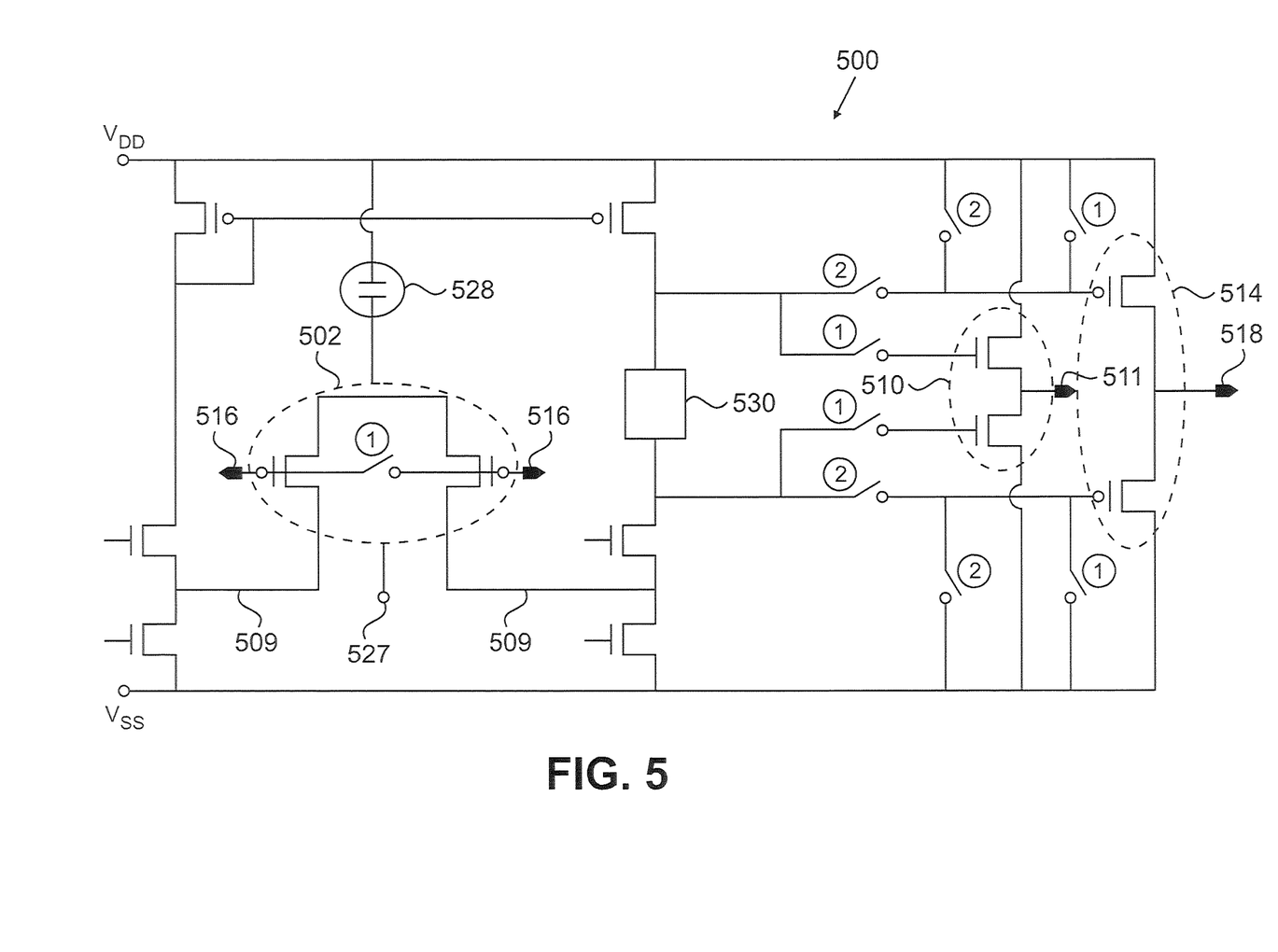
FIG. 5 presents a schematic diagram of another amplifier according to this disclosure.

FIG. 5 presents a schematic diagram of another amplifier 500 according to this disclosure. The amplifier 500 could, for example, be used as the amplifier 102 in FIG. 1. In this example, a differential input signal is received at input terminals 516. The input signal is coupled to inputs of an input stage 502, which includes a positive input device and positive trim devices, as well as a negative input device and negative trim devices. The input stage 502 receives power from a current source 528 and produces intermediate signals 509.

The intermediate signals 509 are coupled to a comparator 510 and an output stage 514. When enabled, the comparator 510 produces an output 511. The output stage 514 is a power stage that, when enabled, amplifies the signal received from the input stage 502 to desired levels to produce an amplified output signal, which is provided to an output terminal 518. While the amplifier 500 receives a differential input signal at the input terminals 516, the amplifier 500 produces a single-ended output at the output terminal 518.

A trimming control circuit (not shown in FIG. 5) is coupled to the output 511 of the comparator 510. The trimming control circuit is also coupled to a control input 527 of the input stage 502 and is operable to control a configuration of the trim devices of the input stage 502. The trimming control circuit is further coupled to a plurality of switches indicated by reference characters (1) and (2), which are operable to enable and disable operation of the comparator 510 and the output stage 514, as well as to selectively couple the inputs 516 to each other.

To configure the amplifier 500 to perform the method 300 of FIG. 3, the trimming control circuit closes the switches labeled (1) and opens the switches labeled (2). This configuration couples the input terminals 516 to each other, enables the comparator 510 by coupling it to a bias voltage source 530, and disables the output stage 514 by coupling its gate terminals to $V_{DD}$ and $V_{SS}$. In this configuration, the output terminal 518 is at a high impedance (i.e., is "tri-stated").

The trimming control circuit may then perform the steps of the method 300, controlling the trim devices of the input devices 502 via control input 527, in order to reduce the offset between the input devices 502.

After a desired configuration for the input devices 502 has been found, the trimming control circuit closes the switches labeled (2) and opens the switches labeled (1). This decouples the inputs 516 from each other, disables the comparator 510, and enables the output stage 514. The amplifier 500 is now ready for operation with its offset in the input devices 502 minimized.

Figure 6A:
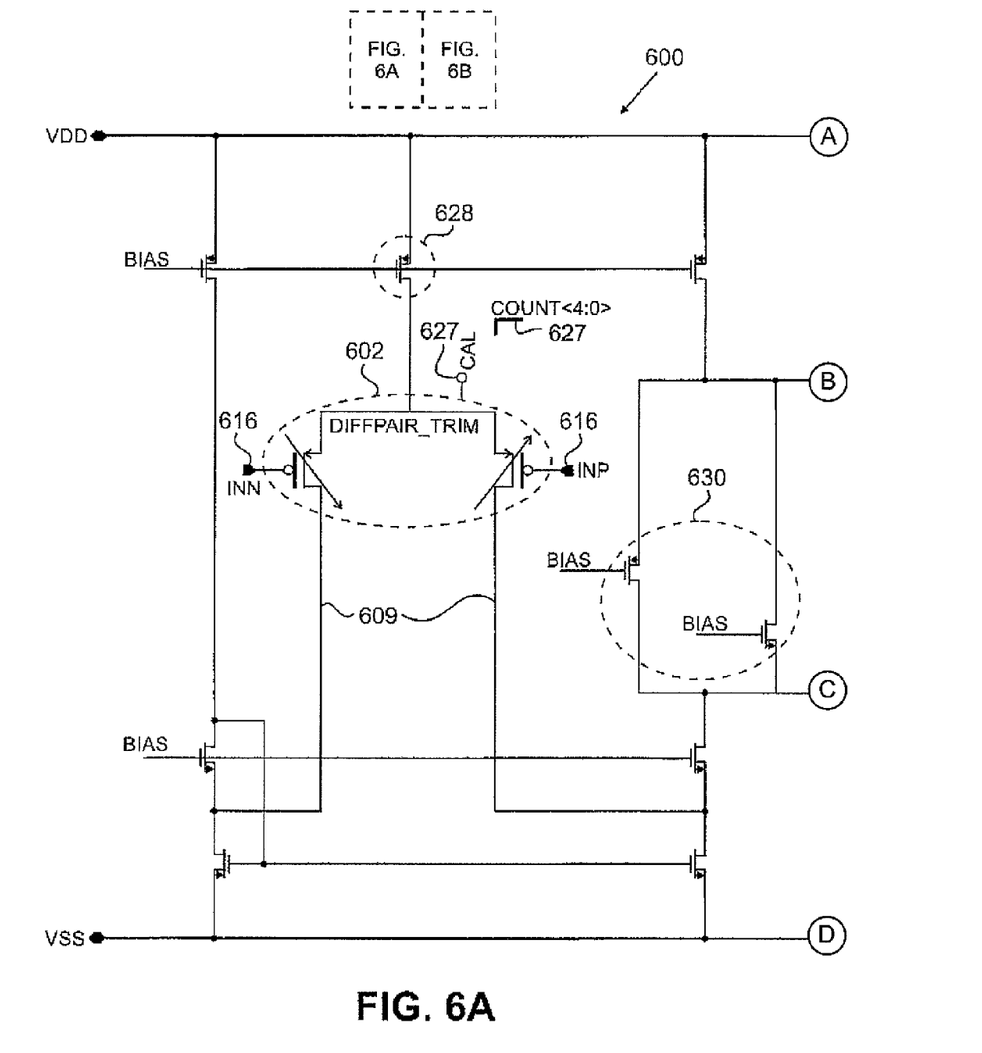
FIGS. 6A and 6B present a schematic diagram of yet another amplifier according to this disclosure.
Figure 6B:
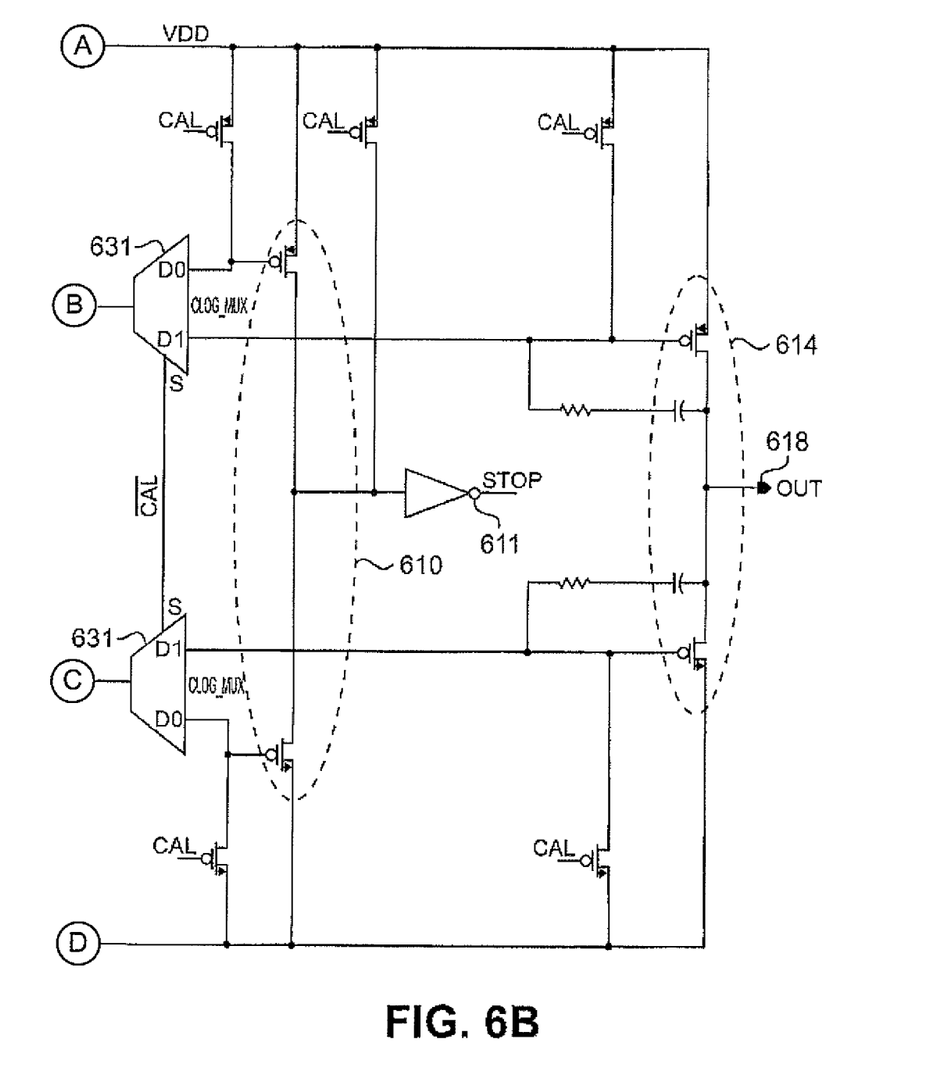

FIGS. 6A and 6B together present a schematic diagram of an amplifier 600 according to this disclosure. The amplifier 600 could, for example, be used as the amplifier 102 in FIG. 1. The amplifier 600 is similar in design to the amplifier 500 of FIG. 5. A differential input signal is received at input terminals 616. The input signal is coupled to inputs of an input stage 602, which includes a positive and negative input device and trim devices. Input stage 602 is described in more detail with reference to FIGS. 7A and 7B. The input stage 602 receives power from a current source 628 and produces intermediate signals 609.

The intermediate signals 609 are coupled to a comparator 610 and an output stage 614. When enabled, the comparator 610 produces an output 611. The output stage 614 is a power stage, which, when enabled, amplifies the signal received from the input stage 602 to desired levels to produce an amplified output signal, which is provided to an output terminal 618. As does the amplifier 500 of FIG. 5, the amplifier 600 produces a single-ended output at the output terminal 618.

A trimming control circuit (not shown in FIGS. 6A and 6B but described in more detail with reference to FIGS. 8A and 8B) is coupled to the output 611 of the comparator 610. The trimming control circuit is also coupled to a control input 627 of the input stage 602 and is operable to control a configuration of the trim devices of the input stage 602. The trimming control circuit is further coupled to a plurality of switches controlled by signals CAL and NOT CAL, which are operable to enable and disable operation of the comparator 610 and the output stage 614, as well as to selectively couple the input terminals 616 to each other.

To configure the amplifier 600 to perform the method 300 of FIG. 3, the trimming control circuit sets control input 627 to have the values CAL high and NOT CAL low. This configuration couples the input terminals 616 to each other, enables the comparator 610 by coupling it to a bias voltage source 630 using analog switches 631, and disables the output stage 614 by coupling its gate terminals to $V_{DD}$ and $V_{SS}$. In this configuration, the output terminal 618 is at a high impedance (i.e., is "tri-stated"). The trimming control circuit may then perform the steps of the method 300, controlling the trim devices of the input stage 602 via the control input 627 values count<4:0>, in order to reduce the offset between the input devices in the input stage 602.

After a desired configuration for the input devices 602 has been found, the trimming control circuit sets the signal CAL low and the signal NOT CAL high. This decouples the input terminals 616 from each other, disables the comparator 611, and enables the output stage 614. The amplifier 600 is now ready for operation with its offset in the input stage 602 minimized.

Figure 7A:
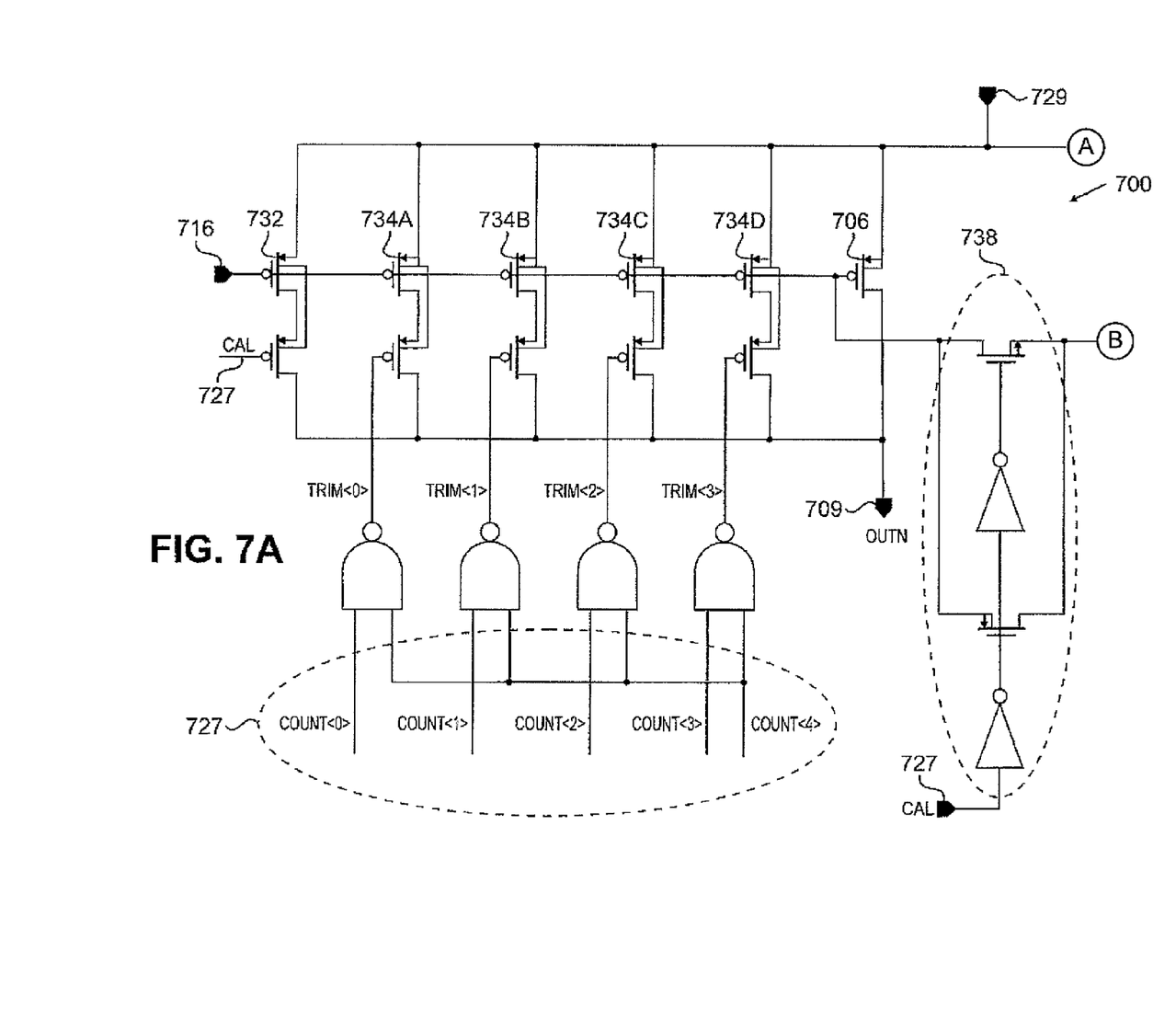
FIGS. 7A and 7B present a schematic diagram of a differential input stage according to this disclosure.
Figure 7B:
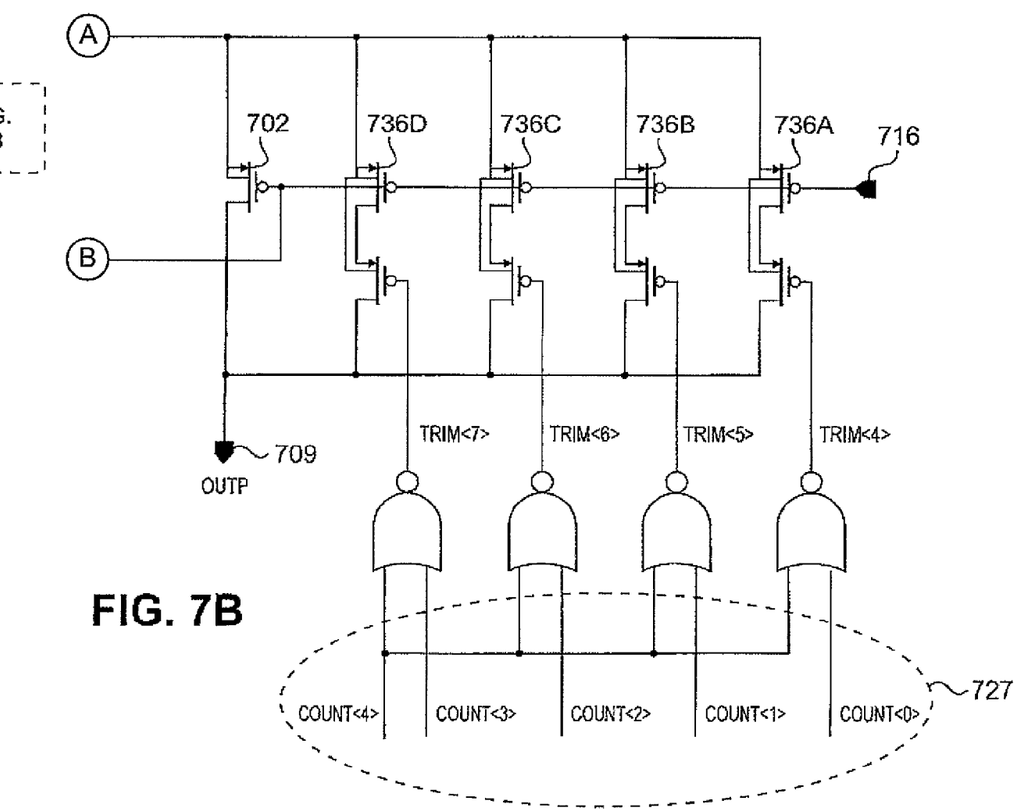

FIGS. 7A and 7B together present a schematic diagram of a differential input stage 700 according to this disclosure. The input stage 700 could, for example, be used as the input stage 602 in FIGS. 6A and 6B or as the input stage 502 in FIG. 5. The input stage 700 receives power from a current source at a terminal 729, an input signal at terminals 716, a first configuration signal CAL and a second configuration signal count<4:0> at terminals 727. An output of the input stage 700 is produced at terminals 709. The control signal CAL is coupled to a switch circuit 738, which is operable to couple the inputs 716 when CAL is high and to decouple the inputs 716 when CAL is low.

The input stage 700 also includes a positive input device 702, coupled in parallel with positive trim devices 736A-D. The input stage 700 further includes a negative input device 706, coupled in parallel with negative trim devices 734A-D. In the embodiment shown in FIGS. 7A and 7B, the positive input device 702 and the negative input device 706 are designed to have a desired size 20X, where X is an arbitrary unit of area. Such a device may also be described as having a desired transconductance of 20X. However, each of the input devices 702 and 706 may have an actual transconductance that is larger or smaller than the design value, often because of process variations during fabrication of the input devices 702 and 706.

In this example, trim devices 734A and 736A have a design size 1X, trim devices 734B and 736B have a design size 2X, trim devices 734C and 736C have a design size 4X, and trim devices 734D and 736D have a design size 8X. An additional negative trim device 732 having a design size 0.5X is coupled in parallel with the negative input device 706 and the negative trim devices 734A-D.

Variations in transconductance arising from size variations, and differences in threshold voltages and/or conduction factors are one source of offset in an amplifier. Another source of offset may be differences in current mirrors. By application of the method 300 of FIG. 3 to the input stage 700, a configuration of the trim devices 732, 734A-D and 736A-D may be found that minimizes the offset from any of these sources in an amplifier that includes an input stage such as the input stage 700.

While the input devices 702 and 706 have a design size expressed as 20X, it will be understood that selection of a different arbitrary unit of area will result in a different coefficient than 20 for expressing the design size of the input devices 702 and 706. Furthermore, while the trim devices 734A-D and 736A-D provide a variability in total effective device area of +/−15X, it will be understood that in other applications where a smaller amount of offset is expected, fewer or smaller trim devices may be used to provide a smaller amount of variability. Similarly, in an application where a larger amount of offset is expected, it will be understood that more or larger trim devices may be used to provide a greater amount of variability.

Additionally, while the trim devices 734A-D and 736A-D provide an offset correction resolution of $\frac{1}{20}^{th}$ the design size of the input devices 702 and 706, other applications may require a finer resolution, in order to obtain a smaller final offset voltage after the trim devices 732, 734A-D and 736A-D have been set to a desired configuration. In such applications, it will be understood that the trim devices 734A and 736A may have a smaller design size than $\frac{1}{20}^{th}$ the size of the input devices. Similarly, where a coarser resolution is acceptable, it will be understood that the trim devices 734A and 736A may have a larger design size than $\frac{1}{20}^{th}$ the size of the input devices.

Control inputs 727 count<4:0> include individual signals count<4>, count<3>, count<2>, count<1> and count<0>, which together form a five-bit binary word. Each of the signals count<3:0>, in combination with the signal count<4>, controls the state of one of the trim devices 734A-D and 736A-D. The coupling of the count<3:0> signals to the trim devices may be as follows: the signal count<0> is coupled to the trim devices 734A and 736A, the signal count<1> is coupled to the trim devices 734B and 736B, the signal count<2> is coupled to the trim devices 734C and 736C, and the signal count<3> is coupled to the trim devices 734D and 736D.

As is explained in more detail with reference to FIGS. 8A and 8B, at the beginning of the method 300 of FIG. 3, all five of the signals count<4:0> may be set low. As a result, all the negative trim devices 734A-D are turned on (or coupled to the drain of the input device 706), and all the positive trim devices 736A-D are turned off (or decoupled from the drain of the input device 702). While the signal count<4> remains low, none of the positive trim devices 736A-D will turn on. Similarly, once the signal count<4> becomes high, none of the negative trim devices 734A-D will turn on.

Because all the positive trim devices 736A-D are turned off, only the positive input device 702 is in the circuit, and the positive side of the input stage 700 has an effective area of 20X. Because all the negative trim devices 734A-D are turned on, they contribute 8X+4X+2X+1X, or 15X, to the total effective area of the negative side of the input stage 700. As a result, the negative side of the input stage 700 has an effective area of 20X+15X, or 35X.

During each loop within the method 300, the binary value represented by the signals count<4:0> counts up by one. After the first increase, the signal count<4:0> has a value 00001, which turns off the negative trim device 734A (or decouples it from the drain of the input device 706), reducing the total effective area of the negative side of the input stage 700 to 34X. After the next increase, the signal count<4:0> has a value 00010, which turns off the negative trim device 734B and turns the trim device 734A back on, reducing the total effective area of the negative side of the input stage 700 to 33X. As may be seen, as the signal count<4:0> counts up by one in each loop of the method 300, the total effective area of the negative side of the input stage 700 is reduced by 1X.

When the signal count<4:0> reaches the value 01111, all the negative trim device 734A-D are off, and the total effective area of the negative side of the input stage 700 is 20X. Furthermore, all the positive trim devices 736A-D are still off, and the total effective area of the positive side of the input stage 700 is also 20X. With the next pass through the loop of the method 300, the value of the signal count<4:0> becomes 10000. With this value, all the negative trim device 734A-D remain off because the signal count<4> is now high, and all the positive trim device 736A-D also remain off because all the signals count<3:0> are low. As such, the total effective areas of the negative and positive sides of the input stage 700 both remain at 20X.

On the next pass through the loop of the method 300, the signal count<4:0> reaches the value 10001, which turns on the trim device 736A (or couples it to the drain of the input device 702) and increases the total effective area of the positive side of the input stage 700 to 21X. Subsequent passes through the loop of the method 300 continue to increase the total effective area of the positive side of the input stage 700 by 1X per loop.

When the comparator coupled to the outputs 709 of the input stage 700 changes state, it is an indication that the configuration of the trim devices 732, 734A-D and 736A-D has just over-compensated for the offset arising from fabrication variations. The change of state of the comparator is indicated to the input stage 700 when the control input CAL, coupled to the terminals 727, becomes low. One effect of the low control input CAL is to cause the switch circuit 738 to open and decouple the inputs 716 from each other.

Another effect of the low control input CAL is to switch the negative trim device 732 into the negative side of the input stage 700. Before switching in the negative trim device 732, the remaining offset is in a range 0-1Y (where Y represents the offset produced by a difference of 1X between the total effective areas of the positive and negative sides of the input stage 700). After switching in the negative trim device 732, the remaining offset will be in a range −0.5Y-+0.5Y.

While the input stage 700 has both positive trim devices 736A-D and negative trim devices 734A-D, it will be understood that in another embodiment a single set of trim devices may be used and switched in parallel with either the positive input device 702 or the negative input device 706. In such an embodiment, the sources of all trim devices may be coupled to the current source via the terminal 729 and the drains of the trim devices selectively coupled to either the drain of the positive input device 702 or the drain of the negative input device 706. In one such embodiment, all trim devices may be coupled in parallel to either the positive input device 702 or the negative input device 706 and selectively enabled or disabled. In another such embodiment, some trim devices may be selectively coupled in parallel with the positive input device 702 and other trim devices may be selectively coupled in parallel with the negative input device 706, while still other trim devices are decoupled from both the input devices 702 and 706.

Figure 8A:
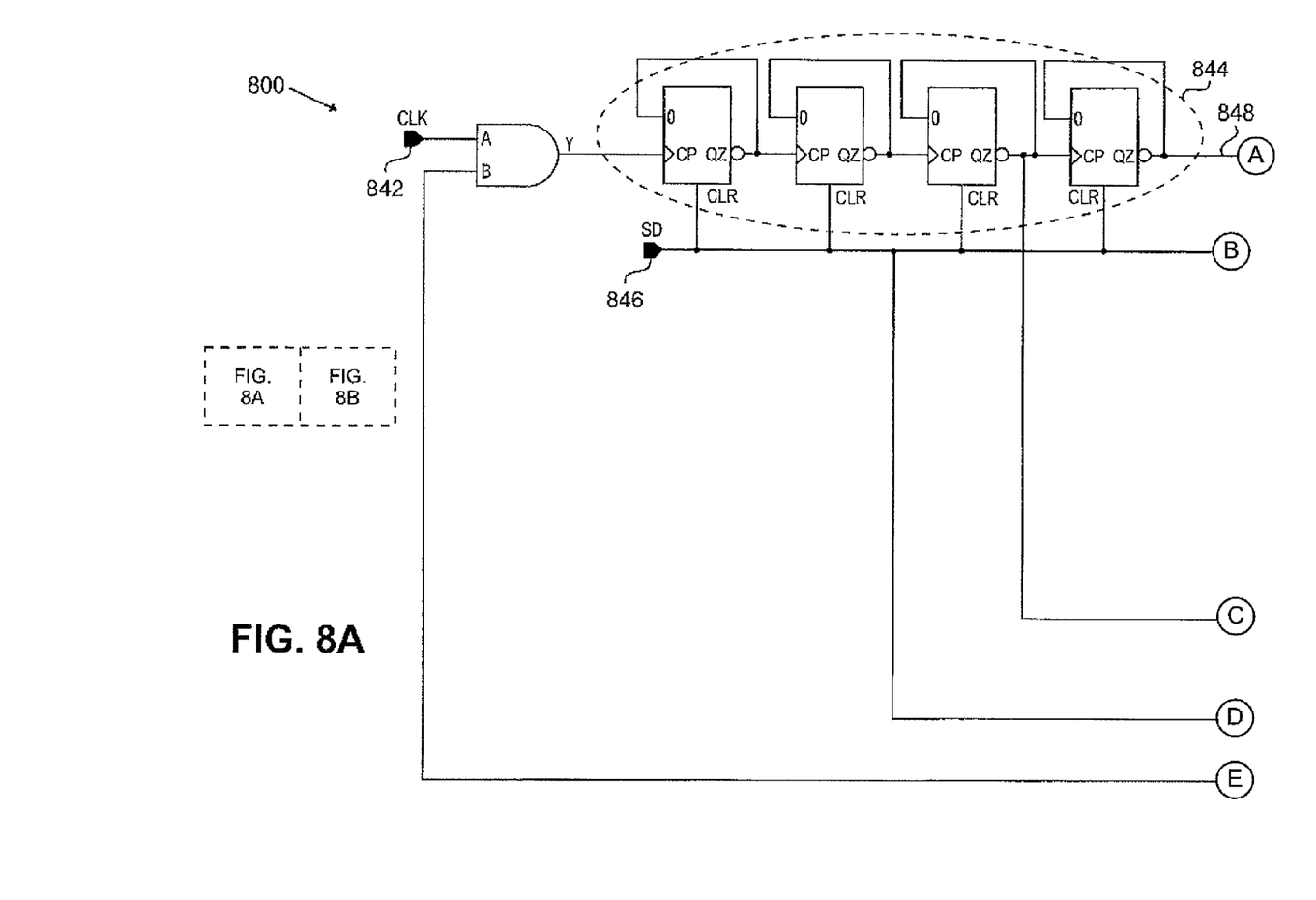
FIGS. 8A and 8B present a schematic diagram of a trimming control circuit according to this disclosure.
Figure 8B:
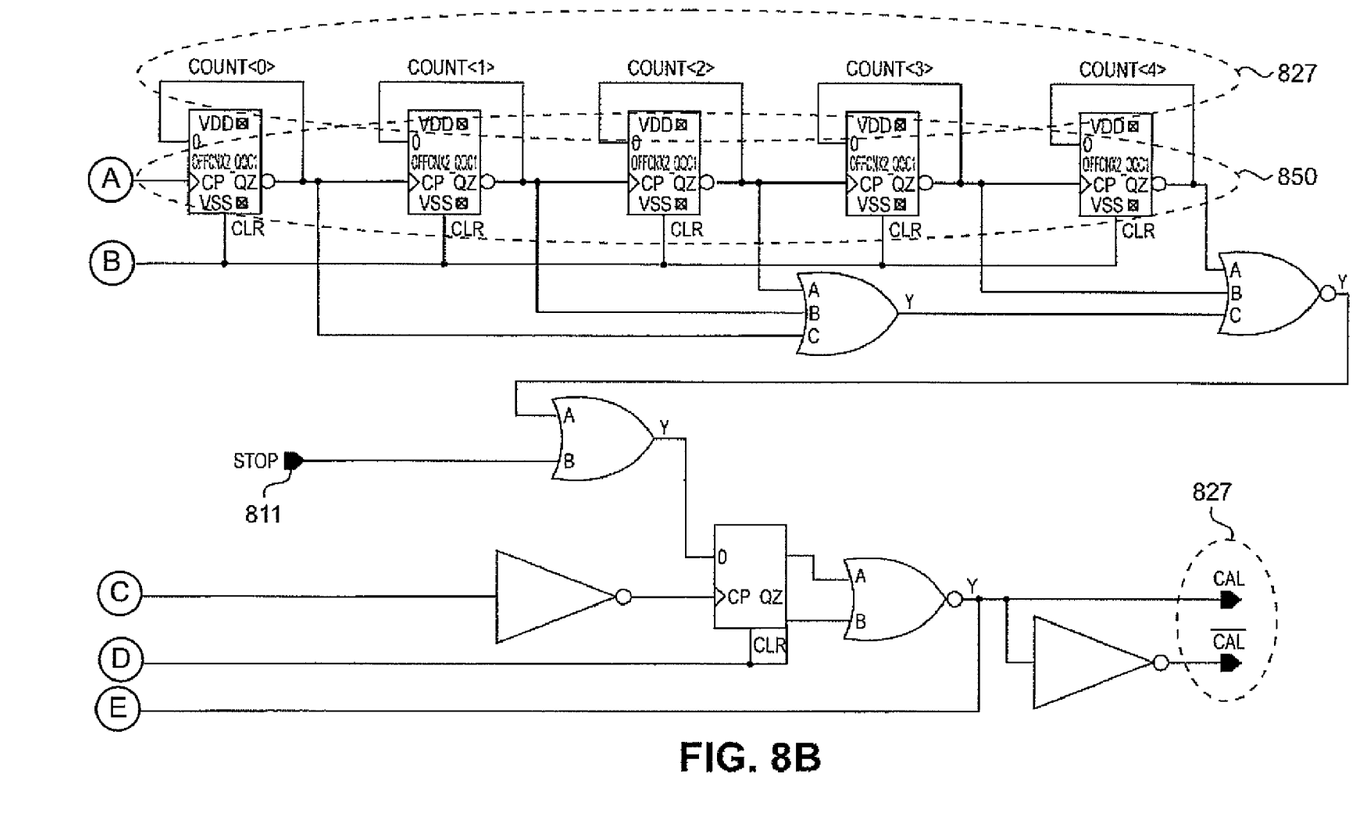

FIGS. 8A and 8B together present a schematic diagram of a trimming controller 800 according to this disclosure. The trimming controller 800 could, for example, be used with the amplifier 600 in FIGS. 6A and 6B or with the amplifier 500 in FIG. 5. A reset signal 846 sets the trimming controller 800 into an initial state with output signals 827 having a value of count<4:0> set to 00000, CAL set to high, and NOT CAL set to low. A clock signal 842 is divided by a divider circuit 844 to produce a lower frequency clock signal 848. The clock signal 848 causes a counter circuit 850 to produce the sequence of values for control signals 827 count<4:0> as described for input stage 700 of FIGS. 7A and 7B.

An input 811 receives a signal, such as the comparator output 511 of FIG. 5 or comparator output 611 of FIGS. 6A and 6B, indicating that a desired configuration of trim devices has been achieved. When the input 811 goes high, the outputs 827 change to have values CAL low and NOT CAL high. A low value on the output CAL causes the trimming controller 800 to stop responding to the clock input 842, which locks the counter 827 to its current value, representing a desired configuration of the input stage 502 in FIG. 5 or the input stage 602 in FIGS. 6A and 6B.

While the trimming controller 800 is shown as having discrete logic elements, it will be understood that the trimming controller 800 may be implemented with a microcontroller, a microprocessor, an application specific integrated circuit (ASIC), a programmable array logic (PAL), or other suitable control circuit.

While the embodiments shown in the figures of this disclosure set forth amplifiers having certain configurations of input stages and power devices, it will be understood that the principles of this disclosure may be applied to any form of amplifier having differential input devices. While the embodiments shown in this disclosure employ CMOS devices, it will be understood that the principles of this disclosure may also be used to reduce offset in amplifiers employing bipolar devices, BiCMOS devices, JFET devices, and other suitable semiconductor technologies. Furthermore, the principles described in this disclosure may be applied to an amplifier operating in any frequency range, including audio, video, and radio frequency amplifiers.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or," is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like; and the term "controller" means any device, system or part thereof that controls at least one operation, such a device may be implemented in hardware, firmware or software, or some combination of at least two of the same.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An amplifier comprising:
    a differential input stage comprising:
        a first input device and a second input device; and
        a first plurality of trim devices coupled in parallel with the first input device such that (i) a source/drain terminal of the first input device and source/drain terminals of the first plurality of trim devices are connected to a common power terminal and (ii) a gate of the first input device and gates of the first plurality of trim devices are adapted to receive a common input signal;
    a comparator coupled to a differential output of the differential input stage; and
    a trimming controller adapted to configure the first plurality of trim devices based on an output of the comparator.

2. The amplifier of claim 1, wherein the trimming controller is adapted to:
    set the first plurality of trim devices to a specified configuration;
    change the configuration of the first plurality of trim devices;
    determine whether the output of the comparator changes state in response to the change in the configuration of the first plurality of trim devices; and
    in response to determining that the output of the comparator has not changed state, repeating the changing and determining operations.

3. The amplifier of claim 1, wherein the first plurality of trim devices are adapted to selectively alter a total effective device area of the first input device.

4. The amplifier of claim 3, wherein each of the first plurality of trim devices, when enabled, adds a specified area to the total effective device area of the first input device.

5. The amplifier of claim 4, wherein the first plurality of trim devices are substantially equal in size.

6. An amplifier comprising:
a differential input stage comprising:
a first input device and a second input device; and
a first plurality of trim devices coupled in parallel with the first input device;
a comparator coupled to a differential output of the differential input stage; and
a trimming controller adapted to configure the first plurality of trim devices based on an output of the comparator;
wherein the input stage further comprises a second plurality of trim devices coupled in parallel with the second input device; and
wherein the trimming controller is adapted to configure the second plurality of trim devices based on the output of the comparator.

7. An amplifier comprising:
a differential input stage comprising:
a first input device and a second input device; and
a first plurality of trim devices coupled in parallel with the first input device;
a comparator coupled to a differential output of the differential input stage;
a trimming controller adapted to configure the first plurality of trim devices based on an output of the comparator; and
an output stage adapted to amplify the differential output of the differential input stage;
wherein the trimming controller is adapted to disable the output stage.

8. A device comprising:
an audio source;
a power supply; and
an amplifier configured to receive power from the power supply and to receive an audio input signal from the audio source, wherein the amplifier comprises:
a differential input stage comprising:
a first input device and a second input device; and
a first plurality of trim devices coupled in parallel with the first input device a first plurality of trim devices coupled in parallel with the first input device such that (i) a source/drain terminal of the first input device and source/drain terminals of the first plurality of trim devices are connected to a common power terminal and (ii) a gate of the first input device and gates of the first plurality of trim devices are adapted to receive a common portion of the audio input signal;
a comparator coupled to a differential output of the differential input stage; and
a trimming controller adapted to configure the first plurality of trim devices based on an output of the comparator.

9. The device of claim 8, wherein the trimming controller is adapted to:
set the first plurality of trim devices to a specified configuration;
change the configuration of the first plurality of trim devices;
determine whether the output of the comparator changes state in response to the change in the configuration of the first plurality of trim devices; and
in response to determining that the output of the comparator has not changed state, repeating the changing and determining operations.

10. The device of claim 8, wherein the trimming controller is adapted to configure the first plurality of trim devices at initial power up of the amplifier.

11. The device of claim 8, wherein each of the first plurality of trim devices, when enabled, adds a specified area to a total effective device area of the first input device.

12. The device of claim 11, wherein the first plurality of trim devices are substantially equal in size.

13. A device comprising:
an audio source;
a power supply; and
an amplifier configured to receive power from the power supply and to receive an audio input signal from the audio source, wherein the amplifier comprises:
a differential input stage comprising:
a first input device and a second input device; and
a first plurality of trim devices coupled in parallel with the first input device;
a comparator coupled to a differential output of the differential input stage; and
a trimming controller adapted to configure the first plurality of trim devices based on an output of the comparator;
wherein the input stage further comprises a second plurality of trim devices coupled in parallel with the second input device; and
wherein the trimming controller is adapted to configure the second plurality of trim devices to reduce an offset between the first input device and the second input device.

14. A device comprising:
an audio source;
a power supply; and
an amplifier configured to receive power from the power supply and to receive an audio input signal from the audio source, wherein the amplifier comprises:
a differential input stage comprising:
a first input device and a second input device; and
a first plurality of trim devices coupled in parallel with the first input device;
a comparator coupled to a differential output of the differential input stage; and
a trimming controller adapted to configure the first plurality of trim devices based on an output of the comparator; and
an output stage adapted to amplify the differential output of the differential input stage;
wherein the trimming controller is adapted to disable the output stage.

15. A method comprising:
enabling a comparator coupled to a differential output of a differential input stage, wherein the differential input stage includes a first input device and a second input device; and
configuring a first plurality of trim devices based on an output of the comparator, the first plurality of trim devices coupled in parallel with the first input device such that (i) a source/drain terminal of the first input device and source/drain terminals of the first plurality of trim devices are connected to a common power terminal and (ii) a gate of the first input device and gates of the first plurality of trim devices receive a common input signal.

16. The method of claim 15, wherein configuring the first plurality of trim devices is performed at initial power up of the amplifier.

17. The method of claim 15, wherein each of the first plurality of trim devices, when enabled, adds a specified area to a total effective device area of the first input device.

18. A method comprising:
   enabling a comparator coupled to a differential output of a differential input stage, wherein the differential input stage includes a first input device and a second input device;
   configuring a first plurality of trim devices coupled in parallel with the first input device based on an output of the comparator; and
   configuring a second plurality of trim devices coupled in parallel with the second input device based on the output of the comparator.

19. The method of claim 18, wherein configuring the first plurality of trim devices comprises:
   setting the first plurality of trim devices to a specified configuration;
   changing the configuration of the first plurality of trim devices;
   determining whether the output of the comparator changes state in response to the change in the configuration of the first plurality of trim devices; and
   in response to determining that the output of the comparator has not changed state, repeating the changing and determining steps.

20. A method comprising:
   enabling a comparator coupled to a differential output of a differential input stage, wherein the differential input stage includes a first input device and a second input device;
   configuring a first plurality of trim devices coupled in parallel with the first input device based on an output of the comparator; and
   while configuring the first plurality of trim devices, disabling an output stage adapted to amplify the differential output of the differential input stage.

* * * * *